US012646236B2

(12) United States Patent
Mostapha et al.

(10) Patent No.: US 12,646,236 B2
(45) Date of Patent: Jun. 2, 2026

(54) MODEL-BASED RECONSTRUCTION FOR GRASP MRI

(71) Applicant: Siemens Healthineers AG, Forchheim (DE)

(72) Inventors: Mahmoud Mostapha, Princeton, NJ (US); Simon Arberet, Princeton, NJ (US); Marcel Dominik Nickel, Herzogenaurach (DE); Mariappan S. Nadar, Plainsboro, NJ (US)

(73) Assignee: Siemens Healthineers AG, Forchheim (DE)

( * ) Notice: Subject to any disclaimer, the term of this patent is extended or adjusted under 35 U.S.C. 154(b) by 280 days.

(21) Appl. No.: 18/468,802

(22) Filed: Sep. 18, 2023

(65) Prior Publication Data

US 2025/0095237 A1     Mar. 20, 2025

(51) Int. Cl.
| | |
|---|---|
| *G06T 12/10* | (2026.01) |
| *G01R 33/48* | (2006.01) |
| *G06N 3/045* | (2023.01) |
| *G06T 7/00* | (2017.01) |

(52) U.S. Cl.
CPC .......... G06T 12/10 (2026.01); G01R 33/4824 (2013.01); G06N 3/045 (2023.01); G06T 7/0012 (2013.01); *G06T 2207/10096* (2013.01)

(58) Field of Classification Search
CPC ............ G01R 33/4824; G01R 33/5608; G06N 3/045; G06N 3/0464; G06N 3/084; G06T 11/005; G06T 2207/10096; G06T 7/0012
See application file for complete search history.

(56) References Cited

U.S. PATENT DOCUMENTS

| | | | | |
|---|---|---|---|---|
| 11,300,645 B2 * | 4/2022 | Schlemper | ............. | A61B 5/055 |
| 11,493,585 B2 * | 11/2022 | Takeshima | ............. | G16H 30/40 |
| 11,681,001 B2 * | 6/2023 | Zeng | ............... | G01R 33/56545 |
| | | | | 706/45 |
| 12,000,918 B2 * | 6/2024 | An | ...................... | G01R 33/5608 |
| 12,092,715 B2 * | 9/2024 | Ersoz | ................. | G01R 33/4824 |
| 12,190,483 B2 * | 1/2025 | Jacob | ..................... | G06N 3/084 |
| 2019/0030371 A1 * | 1/2019 | Han | ...................... | A61N 5/1039 |
| 2020/0000362 A1 * | 1/2020 | Wallace | ............... | A61B 5/7267 |
| 2020/0034998 A1 * | 1/2020 | Schlemper | ............. | A61B 5/055 |
| 2020/0297284 A1 * | 9/2020 | O'Brien | ............... | A61B 5/7267 |
| 2021/0123999 A1 * | 4/2021 | An | ................... | G01R 33/56308 |
| 2021/0219862 A1 * | 7/2021 | Loecher | ................. | A61B 5/055 |

(Continued)

FOREIGN PATENT DOCUMENTS

| | | | | | |
|---|---|---|---|---|---|
| CA | 3074064 A1 * | 9/2020 | ......... | G01R 33/5608 |
| CN | 115769096 A * | 3/2023 | ....... | G01R 33/56545 |

OTHER PUBLICATIONS

Yufei Zhang et al. ,"Dynamic MRI of the abdomen using parallel non-Cartesian convolutional recurrent neural networks," Feb. 25, 2021, Magnetic Resonance in Medicine, 2021, pp. 964-970.*

(Continued)

*Primary Examiner* — Omar S Ismail

(57) ABSTRACT

Systems and methods for a deep learning reconstruction network with computationally light and efficient CNN architecture and a training strategy tailored to image reconstruction of dynamic multi-coil GRASP MRI. The configuration of the size of the network used in training time may be adjusted, which allows for higher accelerations and different hardware constraints.

20 Claims, 7 Drawing Sheets

(56)        References Cited

U.S. PATENT DOCUMENTS

| | | | |
|---|---|---|---|
| 2022/0222781 A1* | 7/2022 | Jacob ........................ | G06N 3/08 |
| 2023/0056838 A1* | 2/2023 | Schwab ........... | G01R 33/56341 |
| 2023/0236271 A1* | 7/2023 | Fessler ............... | G01R 33/4826 |
| | | | 324/309 |
| 2024/0233093 A1* | 7/2024 | Novikov ................... | G06T 5/50 |
| 2024/0260848 A1* | 8/2024 | Cai ........................ | A61B 5/055 |
| 2024/0290011 A1* | 8/2024 | Zhou .................. | G01R 33/5608 |
| 2025/0004085 A1* | 1/2025 | Arberet ..................... | G06T 7/97 |
| 2025/0095237 A1* | 3/2025 | Mostapha .......... | G01R 33/5608 |

OTHER PUBLICATIONS

Li Feng et al.,: "Golden-Angle Radial Sparse Parallel MRI: Combination of Compressed Sensing, Parallel Imaging, and Golden-Angle Radial Sampling for Fast and Flexible Dynamic Volumetric MRI," Oct. 18, 2013, Magnetic Resonance in Medicine 72,2014,pp. 707-716.*

Hassan Haji-Valizadeh et al.,"Rapid Reconstruction of Four-dimensional MR Angiography of the Thoracic Aorta Using a Convolutional Neural Network," Jun. 25, 2020, Radiology: Cardiothoracic Imaging,vol. 2, No. 3 , pp. 1-5.*

Chaithya Giliyar Radhakrishna et al.,"Jointly Learning Non-Cartesian k-Space Trajectories and Reconstruction Networks for 2D and 3D MR Imaging through Projection, " Jan. 24, 2023, Bioengineering 2023, 10, 158,pp. 1-14.*

Andreas Kofler et al. ,"An end-to-end-trainable iterative network architecture for accelerated radial multi-coil 2D cine MR image reconstruction," Apr. 1, 2021, Med. Phys. 48 (5), May 2021,pp. 2412-2422.*

Extended European Search Report mailed Apr. 1, 2025 in counterpart European Patent Application No. 24201112.0.

Andreas Kofler et al: "An End-To-End-Trainable Iterative Network Architecture for Accelerated Radial Multi-Coil 2D Cine MR Image Reconstruction", arxiv.org, Cornell University Library, 201 Olin Library Cornell University Ithaca, NY 14853, Feb. 1, 2021; p. 3-p. 12; figures 1, 2; p. 16-p. 20; figures 5, 6.

Li Feng et al: "Golden-angle radial sparse parallel MRI: Combination of compressed sensing, parallel imaging, and golden-angle radial sampling for fast and flexible dynamic volumetric MRI", Magnetic Resonance in Medicine, vol. 72, No. 3, Oct. 18, 2013 (Oct. 18, 2013), pp. 707-717.

Hestenes, Magnus R. and Eduard Stiefel; "Methods of conjugate gradients for solving linear systems"; Journal of research of the National Bureau of Standards 49.6 (1952); pp. 409-436.

Jafari, Ramin, et al. "Graspnet: Fast spatiotemporal deep learning reconstruction of golden-angle radial data for free-breathing dynamic contrast-enhanced magnetic resonance imaging." NMR in Biomedicine (2022): e4861.

Yaman, Burhaneddin, et al. "Self-supervised learning of physics-guided reconstruction neural networks without fully sampled reference data"; Magnetic resonance in medicine 84.6 (2020); pp. 3172-3191.

Zhu, Xizhou, et al.; "Deformable convnets v2: More deformable, better results"; Proceedings of the IEEE/CVF conference on computer vision and pattern recognition; 2019, pp. 1-13.

* cited by examiner

610 Train CNN

620 Select Number of Iterations

630 Assemble Reconstruction Network with the Selected Number of Iterations

640 Train Reconstruction Network

650 Apply Reconstruction Network

MODEL-BASED RECONSTRUCTION FOR GRASP MRI

FIELD

This disclosure relates to medical image reconstruction, such as reconstruction in magnetic resonance (MR) imaging.

BACKGROUND

Magnetic resonance imaging (MRI) is an important and useful imaging modality used in clinical practice. MRI is a non-invasive imaging technology that produces three dimensional detailed anatomical images. It is often used for disease detection, diagnosis, and treatment monitoring. Most clinical MR images are acquired using a Cartesian sampling trajectory. Using a Cartesian trajectory, MR measurements (also known as k-space lines) are collected in a sequential line-by-line manner to fill in a Cartesian grid. When a Nyquist sampling rate is satisfied for k-space acquisition, a Fast Fourier Transform (FFT) may be performed to reconstruct an MR image. The MR image may then be used by clinicians to diagnosis a patient. The image data may also be further processed for additional analysis. While Cartesian sampling is used in a majority of applications, in recent years, radial sampling, e.g. non-Cartesian sampling, has captured substantial attention and interest for use in MRI.

Instead of collecting k-space lines in a parallel scheme as in the Cartesian trajectory, radial sampling collects k-space lines in a star shape. Each radial k-space line (referred to as a radial spoke or simply a spoke) passes through the center of k-space. Similar to Cartesian sampling, all the rotating radial spokes are also acquired line-by-line sequentially but overlapping around the center of k-space. These radial k-space measurements may then be processed to reconstruct an MR image. This sampling scheme offers flexibility to design how those radial spokes are rotated from one to the next. One of the most well-known and most often used rotation scheme is golden-angle radial sampling in which radial spokes are rotated by a so-called "golden angle" (e.g. 111.25° for two-dimensional radial sampling). This process may be referred to as GRASP (Golden-angle RAdial Sparse Parallel imaging).

Radial sampling offers several advantages for MRI applications, including improved robustness to motion compared to standard Cartesian sampling, incoherent under sampling behavior that can be synergistically combined with sparse MRI reconstruction, and continuous data acquisition with flexible data sorting among other benefits. In addition, radial sampling also offers self-navigation that can be exploited to improve motion management.

While non-Cartesian trajectories have many advantages, they are considerably more difficult to use for reconstruction as the non-Cartesian data points do not fall on a grid in k-space. Certain deep learning methods have been proposed to reconstruct dynamic sampling sequences such as GRASP-NET. However, in order to reduce the computation and memory requirements, these methods process the data entirely in the image domain, i.e. with no data-consistency step. This approach reduces the computational and memory footprint of the reconstruction network, but at the expense of removing completely the data-consistency step. Without data consistency, such an approach risks losing clinically relevant details and being less robust to hallucinations. Moreover, without the need for expensive retraining of the model, such a method can only reconstruct GRASP MRI images with a pre-defined acceleration, which limits their usage in practice.

SUMMARY

By way of introduction, the preferred embodiments described below include methods, systems, instructions, and computer readable media for non-cartesian magnetic resonance imaging (MRI) data.

In a first aspect, a method for reconstructing non-cartesian magnetic resonance imaging (MRI) data, the method comprising: training a convolutional neural network (CNN) on image pairs to minimize a loss; selecting a number of iterations for a reconstruction network; assembling the reconstruction network with the number of iterations of the CNN, each iteration further including a data consistency step, wherein the CNN of different iterations share the same weights; training the reconstruction network end to end; and applying the reconstruction network to non-cartesian MRI data of a patient acquired from a medical imaging procedure.

In a second aspect, a system for magnetic resonance imaging (MRI) reconstruction, the system comprising: an MR imaging device configured to acquire non cartesian MRI data of a patient; a reconstruction network configured to input the non cartesian MRI data and output a representation, the reconstruction network comprising a selected number of iterations, wherein each iteration includes a convolutional neural network (CNN) and a data consistency step, wherein the reconstruction network is trained in two stages, wherein in a first stage of the two stages a single iteration of the CNN is trained, wherein in a second stage of the two stages, the reconstruction network comprising the selected number of iterations is trained end to end wherein weights for the CNN in each iteration are initialized with weights learned in the first stage; and a display configured to display the representation.

In a third aspect, a method for MRI reconstruction, the method comprising: acquiring non cartesian MRI data of a patient; reconstructing a representation of the patient using a reconstruction network configured to input the non cartesian MRI data and output a representation, the reconstruction network comprising a selected number of iterations, wherein each iteration includes a convolutional neural network (CNN) and a data consistency step, wherein the reconstruction network is trained in two stages, wherein in a first stage of the two stages a single iteration of the CNN is trained, wherein in a second stage of the two stages, the reconstruction network comprising the selected number of iterations is trained end to end wherein weights for the CNN in each iteration are initialized with weights learned in the first stage; and displaying the representation of the patient.

The present invention is defined by the following claims, and nothing in this section should be taken as a limitation on those claims. Further aspects and advantages of the invention are discussed below in conjunction with the preferred embodiments and may be later claimed independently or in combination.

DETAILED DESCRIPTION

Embodiments provide systems and methods including a deep learning reconstruction network with a computationally light and efficient CNN architecture for dynamic multicoil GRASP MRI. Embodiments further provide a training strategy for the deep learning reconstruction network. Forward and adjoint non-uniform fast Fourier transform (NuFFT) operators may be included in the network architecture which provides the training of a robust CNN that is stable to small perturbations and adversarial attacks. The configuration of the network size may also be adjusted, which allows for higher accelerations and different hardware constraints.

Figures 1A, 1B:
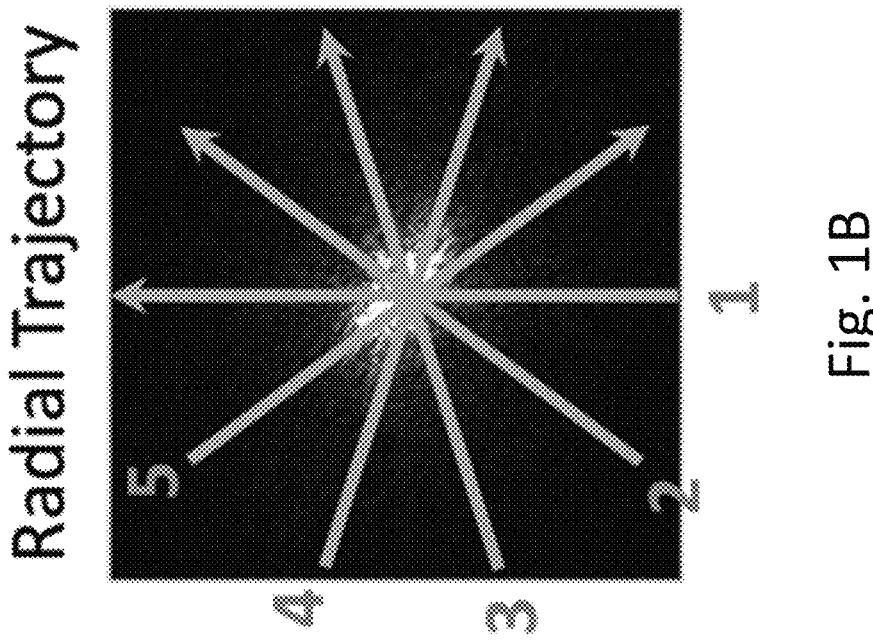
FIGS. 1A and 1B depict examples of cartesian and radial trajectories.

Most clinical MR imaging is performed by acquiring k-space along a Cartesian, or rectilinear, trajectory. FIGS. 1A and 1B depict examples of k-space data acquired using Cartesian and non-Cartesian sampling respectively. For Cartesian sampling, data is sampled line-by-line on a rectangular grid as shown on the left in FIG. 1A. A benefit of this sampling trajectory is that the data is uniformly sampled, and images may be easily and quickly reconstructed using a fast Fourier transform (FFT). However, k-space may also be sampled in a non-Cartesian manner for example as shown on the right in FIG. 1B where radial sampling acquires k-space lines in a star shape. Different sampling trajectories will have different properties and implications for the reconstructed image. However, most if not all non-Cartesian reconstructions performed use a non-uniform fast Fourier transform (NuFFT).

The use of non-Cartesian trajectories provides more efficient coverage of k-space, that may be leveraged to reduce scan times. These trajectories may be under sampled to achieve even faster scan times, but the resulting images may contain aliasing artifacts. Just as Cartesian parallel imaging may be employed to reconstruct images from under sampled Cartesian data, non-Cartesian parallel imaging methods may mitigate aliasing artifacts by using additional spatial encoding information in the form of the non-homogeneous sensitivities of multi-coil phased arrays. Sampling along a non-Cartesian trajectory may have many benefits based on the unique properties of these trajectories. One of the most important properties of non-Cartesian trajectories is their potential for efficient use of MR gradient hardware and therefore rapid coverage of k-space. Additionally, many non-Cartesian trajectories contain fewer coherent artifacts from under sampling are less affected by motion, allow image contrast to be updated throughout data acquisition, and/or enable motion correction, self-navigation, ultra-short TE acquisitions, spectrally selective imaging, and chemical shift imaging. The GRASP (Golden-angle RAdial Sparse Parallel imaging) sequence is one example of a magnetic resonance imaging (MRI) sequence that combines the motion robustness of radial sampling with the acceleration capability of compressed sensing.

In standard Cartesian sampling, k-space data are sampled with an equal space along each spatial dimension, which allows for image reconstruction with a simple FFT when the Nyquist sampling rate is satisfied. Radial sampling, in contrast, leads to unequally spaced k-space data, which prevents direct FFT reconstruction. Reconstructing radial k-space data typically involves a process called gridding before the FFT, in which radial data are interpolated onto a Cartesian grid. The interpolation can be performed with a predefined kernel, with which each radial sample is smeared to neighbor Cartesian locations based on their distance and corresponding weight defined in the kernel. This entire reconstruction process is also referred to as non-uniform since it aims to reconstruct an image from unequally spaced (thus nonuniform) k-space data. The need for gridding in radial image reconstruction inevitably prolongs overall reconstruction time, particularly in iterative reconstruction.

Embodiments described herein provide a plug-and-play efficient and flexible deep learning architecture for image reconstruction of accelerated GRASP MRI with multiple receiver coils. The length of the proposed network (i.e., the number of iterations) may be increased (or decreased) at test time, allowing for the model's efficient training (with limited computational power) while still allowing for improved reconstructions at higher accelerations. The forward and adjoint NUFFT operators are included in the network architecture, which enables the training of a reconstruction network that is stable to small perturbations and adversarial attacks. At test time, the size of the network may be increased (or decreased) by adding additional iterations that are initialized with the learned weights from a pre-training step. The flexible configuration allows for higher accelerations and different hardware constraints to be taken into account. With the small size of each network iteration/block, an increased number of trainable parameters may be used leading to better reconstruction quality.

Figure 2:
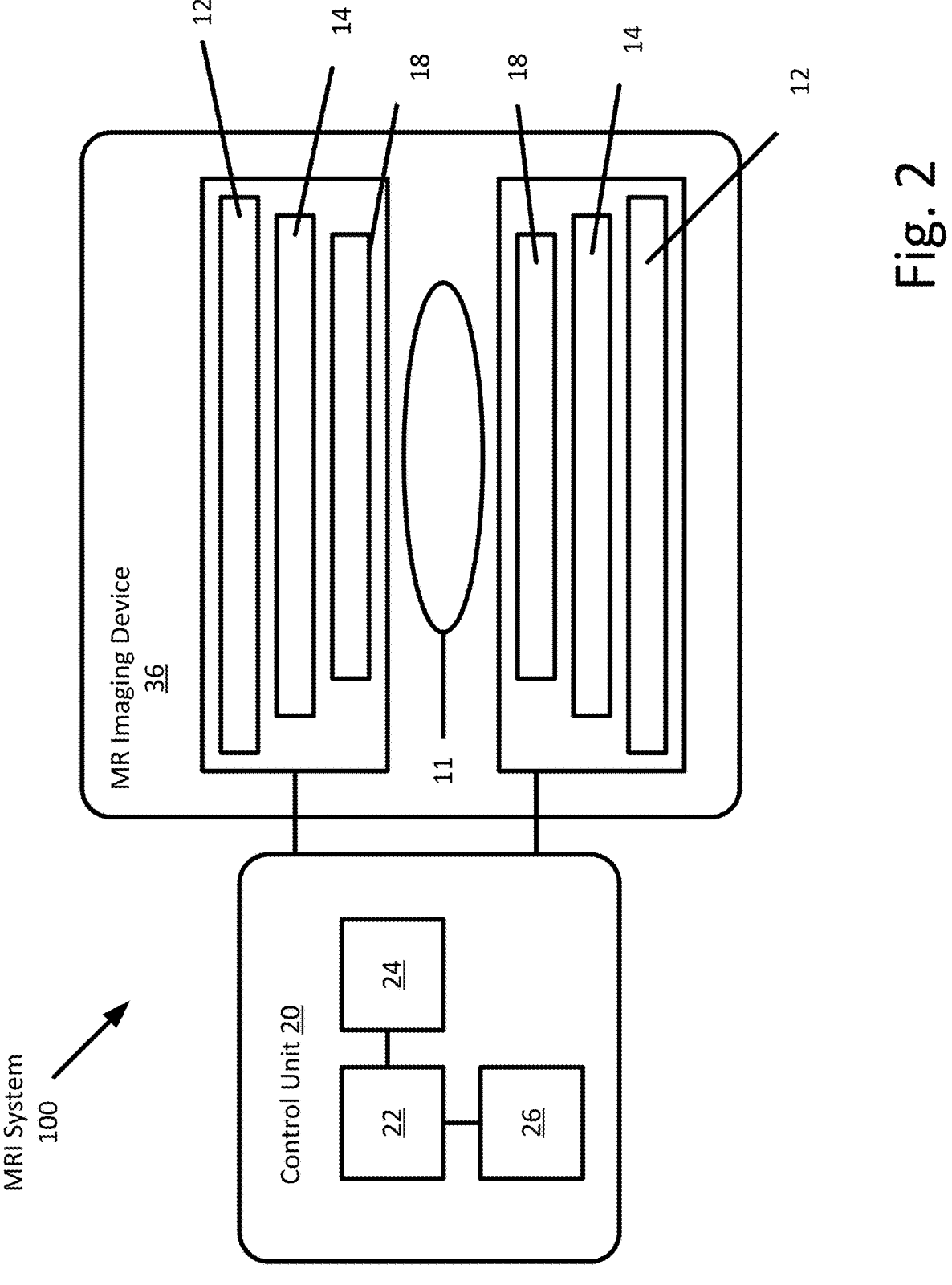
FIG. 2 depicts an example MRI system for acquiring non-cartesian MRI data.

FIG. 2 depicts an example system for acquiring and reconstructing non-Cartesian MRI data. FIG. 2 depicts an MR imaging device 36 that is configured to acquire k-space scan data using a dynamic MR sequence such as GRASP. The control unit 20 reconstructs an MR image from the k-space scan data using a reconstruction that includes at least a data-consistency step. The MR image may be output for display or further processing.

The MR system 100 includes an MR scanner 36 or system, a computer based on data obtained by MR scanning, a server, or another processor 22. The MR imaging device 36 is only exemplary, and a variety of MR scanning systems can be used to collect the MR data. The MR imaging device 36 (also referred to as a MR scanner or image scanner) is configured to scan a patient 11. The scan provides scan data in a scan domain. The MR imaging device 36 scans a patient 11 to provide k-space measurements (measurements in the frequency domain).

The MR system 100 further includes a control unit 20 configured to process the MR signals and generate images of the object or patient 11 for display to an operator. The control unit 20 includes a processor 22 that is configured to execute instructions, or the method described herein. The control unit 20 may store the MR signals and images in a memory 24 for later processing or viewing. The control unit 20 may include a display 26 for presentation of images to an operator.

In the MR system 100, magnetic coils 12 create a static base or main magnetic field B0 in the body of patient 11 or an object positioned on a table and imaged. Within the magnet system are gradient coils 14 for producing position dependent magnetic field gradients superimposed on the static magnetic field. Gradient coils 14, in response to gradient signals supplied thereto by a gradient and control unit 20, produce position dependent and shimmed magnetic field gradients in three orthogonal directions and generate magnetic field pulse sequences. The shimmed gradients compensate for inhomogeneity and variability in an MR imaging device magnetic field resulting from patient ana- tomical variation and other sources.

The control unit 20 may include a RF (radio frequency) module that provides RF pulse signals to RF coil 18. The RF coil 18 produces magnetic field pulses that rotate the spins of the protons in the imaged body of the patient 11 by ninety degrees or by one hundred and eighty degrees for so-called "spin echo" imaging, or by angles less than or equal to 90 degrees for "gradient echo" imaging. Gradient and shim coil control modules in conjunction with RF module, as directed by control unit 20, control slice-selection, phase-encoding, readout gradient magnetic fields, radio frequency transmis- sion, and magnetic resonance signal detection, to acquire magnetic resonance signals representing planar slices of the patient 11.

In response to applied RF pulse signals, the RF coil 18 receives MR signals, e.g., signals from the excited protons within the body as the protons return to an equilibrium position established by the static and gradient magnetic fields. The MR signals are detected and processed by a detector within RF module and the control unit 20 to provide an MR dataset to a processor 22 for processing into an image. In some embodiments, the processor 22 is located in the control unit 20, in other embodiments, the processor 22 is located remotely, for example in a server, the cloud, or other computing unit. A two or three-dimensional k-space storage array of individual data elements in a memory 24 of the control unit 20 stores corresponding individual fre- quency components including an MR dataset. The k-space array of individual data elements includes a designated center, and individual data elements individually include a radius to the designated center.

A magnetic field generator (including coils 12, 14 and 18) generates a magnetic field for use in acquiring multiple individual frequency components corresponding to indi- vidual data elements in the storage array. The individual frequency components are successively acquired using a non-cartesian or other spatial acquisition strategy as the multiple individual frequency components are sequentially acquired during acquisition of an MR dataset.

The control unit 20 may use information stored in an internal database to process the detected MR signals in a coordinated manner to generate high quality images of a selected slice(s) of the body (e.g., using the image data processor) and adjusts other parameters of the system 100. The stored information includes a predetermined pulse sequence of an imaging protocol and a magnetic field gradient and strength data as well as data indicating timing, orientation, and spatial volume of gradient magnetic fields to be applied in imaging.

The MR imaging device 36 is configured by the imaging protocol to scan a region of a patient 11. For example, in MR, such protocols for scanning a patient 11 for a given examination or appointment include diffusion-weighted imaging (acquisition of multiple b-values, averages, and/or diffusion directions), turbo-spin-echo imaging (acquisition of multiple averages), or contrast. In one embodiment, the protocol is for compressed sensing.

In an embodiment, a dynamic contrast-enhanced mag- netic resonance imaging (DCE-MRI) method known as golden-angle radial sparse parallel (GRASP) is used. This embodiment may use a combination of compressed sensing and parallel imaging to acquire simultaneous high spatial and temporal resolution. The GRASP technique exploits joint multicoil sparsity techniques to allow continuous acquisition of dynamic information before, during, and after contrast agent injection. In an embodiment, the MR data may represent a volume. Three-dimensional datasets are obtained. As k-space data, information content may be provided that is responsive to a three-dimensional distribu- tion of locations, but the data itself does not directly repre- sent the locations prior to transform. In alternative embodi- ments, two-dimensional datasets representing or responsive to tissue in planes are obtained. In other embodiments, sequences of MR data responsive to the same tissue over time are acquired. In an example, two-dimensional GRASP may be used for fast real time dynamic MR for two- dimensional application. For three-dimensional applica- tions, volumetric acquisitions can be performed using, for example stack-of-stars (e.g., Cartesian sampling along the z axis and radial sampling along the y and x axis) and/or three-dimensional golden-angle radial trajectories.

The system 100 may include an operator interface that is coupled to the control unit 20. The operator interface may include an input interface and an output interface. The input may be an interface, such as interfacing with a computer network, memory, database, medical image storage, or other source of input data. The input may be a user input device, such as a mouse, trackpad, keyboard, roller ball, touch pad, touch screen, or another apparatus for receiving user input. The output is a display device 26 but may be an interface. The final and/or intermediate MR images reconstructed from the scan are displayed. For example, an image of a region of the patient 11 is displayed. A generated image of the reconstructed representation for a given patient 11 is pre- sented on a display 26 of the operator interface. The display 26 is a CRT, LCD, plasma, projector, printer, or other display device. The display 26 is configured by loading an image to a display plane or buffer. The display 26 is configured to display the reconstructed MR image of the region of the patient 11. The processor 22 of the operator interface forms a graphical user interface (GUI) enabling user interaction with MR imaging device 36 and enables user modification in substantially real time. The control unit 20 processes the magnetic resonance signals to provide image representative data for display on the display 26, for example.

The processor 22 is a processor 22 that reconstructs a representation of the patient 11 from the k-space data. The processor 22 inputs the k-space data and reconstructs an image using an iterative reconstruction process.

Different reconstruction processes may be used depend- ing on the type of sequence used. The processor 22 is a general processor, digital signal processor, three-dimen- sional data processor, graphics processing unit, application specific integrated circuit, field programmable gate array, artificial intelligence processor, digital circuit, analog cir- cuit, combinations thereof, or another now known or later developed device for reconstruction. The processor 22 is a single device, a plurality of devices, or a network. For more than one device, parallel or sequential division of processing may be used. Different devices making up the processor 22 may perform different functions, such as reconstructing by one device and volume rendering by another device. In one embodiment, the processor 22 is a control processor or other processor of the MR system 100. Other processors of the MR system 100 or external to the MR system 100 may be used. The processor 22 is configured by software, firmware, and/or hardware to reconstruct. The instructions for imple- menting the processes, methods, and/or techniques dis- cussed herein are provided on non-transitory computer-readable storage media or memories, such as a cache, buffer, RAM, removable media, hard drive, or other computer readable storage media. The instructions are executable by the processor or another processor. Computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the instructions set, storage media, processor or processing strategy and may be performed by software, hardware, integrated circuits, firmware, micro code, and the like, operating alone or in combination. In one embodiment, the instructions are stored on a removable media device for reading by local or remote systems. In other embodiments, the instructions are stored in a remote location for transfer through a computer network. In yet other embodiments, the instructions are stored within a given computer, CPU, GPU, or system. Because some of the constituent system components and method steps depicted in the accompanying figures may be implemented in software, the actual connections between the system components (or the process steps) may differ depending upon the manner in which the present embodiments are programmed.

The processor 22 is configured to reconstruct a representation of a scan region, such as a region of the patient 11. The processor 22 is configured to reconstruct a representation in an object domain. The representation or object in the object domain is reconstructed from the scan data in the scan domain. The scan data is a set or frame of k-space data from a scan of the patient 11. The object domain is an image space and corresponds to the spatial distribution of the patient 11. A planar or volume representation or object is reconstructed as an image representing the patient 11. For example, pixels values representing tissue in an area or voxel values representing tissue distributed in a volume are generated.

The processor 22 performs reconstruction. The reconstruction is performed, at least in part, using a machine-learned model or algorithm. A machine-learned model is used for at least part of the reconstruction, such as for regularization. In regularization, the image or object domain data is input, and image or object domain data with less artifact is output. The remaining portions or stages of the reconstruction may be performed using reconstruction algorithms and/or other machine-learned networks. In other embodiments, a machine-learned model is used for all the reconstruction operations (one model to input k-space data and output regularized image data) or other reconstruction operations (e.g., used for transform, gradient operation, and/or regularization). The reconstruction is of an object or image domain from projections or measurements in another domain, and the machine-learned model is used for at least part of the reconstruction.

Figure 3:
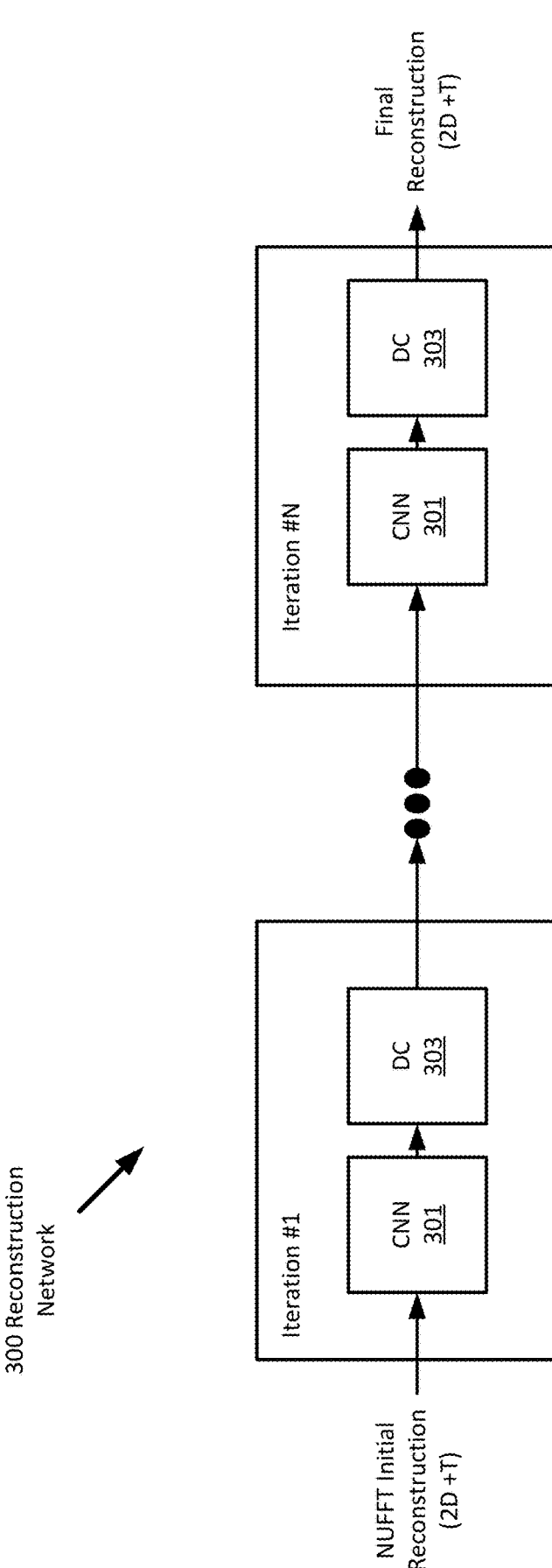
FIG. 3 depicts an example of a reconstruction network according to an embodiment.

FIG. 3 depicts an example of a reconstruction network 300 with N iterations of CNNs 301 followed by a data consistency (DC) step 303. A NuFFT initial reconstruction is input into the first iteration which includes a copy of the CNN 301 and the DC step 303. The initial NUFFT reconstruction is obtained by re-gridding density-compensated measured k-space coefficients onto a Cartesian grid and applying an IFFT. The output of the first iteration is input into a second iteration and so on for N iterations. The output of the final iteration is the final reconstruction. The CNNs 301 of different iterations share the same weights, which allows the flexibility to vary the number of iterations N at test time depending on the desired reconstruction quality and the targeted acceleration. This also provides the model's training with higher spatial/temporal resolution data with reasonable computing (GPU/memory) requirements. For training, a pretraining step is used in which a single CNN 301 is trained on image pairs (initial NuFFT reconstruction and corresponding ground truth) using supervised learning to minimize a given loss such as complex L1. In the next stage of training, a complete reconstruction network 300 is constructed with data consistency layers 303 added with the weights of each of the CNN 301 instances initialized from the first stage. This stage of training is used to fine-tune the CNN weights for the complete reconstruction network 300 as well as learn a regularization parameter in each iteration for an optimal final reconstruction.

The CNN 301 may be any type of CNN 301 that performs regularization. In one embodiment, deep learning is used to train a CNN 301 as the regularizer. Machine learning uses an offline training phase where the goal is to identify an optimal set of values of learnable parameters of the model/network that can be applied to many different inputs (i.e., image domain data after gradient calculation in the optimization or minimization of the reconstruction). The machine-learned parameters may subsequently be used during clinical operation to rapidly reconstruct images. Once learned, the machine-learned model is used in an online processing phase in which MR scan data y (e.g., k-space measurements) for patients is input and the reconstructed representations for the patients are output based on the model values learned during the training phase. Other functions may use machine-learned models or networks. During application to one or more different patients and corresponding different measurements, the same learned weights or values for the machine-learned network are used for each iteration. The model and values for the learnable parameters are not changed from one patient to the next, at least over a given time (e.g., weeks, months, or years) or given number of uses (e.g., tens or hundreds). These fixed values and corresponding fixed model are applied sequentially and/or by different processors to scan data for different patients. The model may be updated, retrained, or replaced but does not learn new values as part of application for a given patient.

The CNN 301 includes an architecture that defines the learnable variables and the relationships between the variables. In one embodiment for the regularization, a neural network is used, but other networks may be used. For example, a convolutional neural network (CNN) 301 is used. Any number of layers and nodes within layers may be used. A DenseNet, U-Net, encoder-decoder, Deep Iterative Down-Up CNN, and/or another network may be used. In one embodiment, an image-to-image neural network (spatial distribution input and spatial distribution output) is used. The image-to-image neural network may include convolution layers or be a CNN 301. Some of the network may include dense blocks (i.e., multiple layers in sequence outputting to the next layer as well as the final layer in the dense block). Any known or later developed neural network may be used.

Deep learning is used to train the model for each iteration where machine learning is used. The training learns both the features of the input data and the conversion of those features to the desired output (i.e., denoised or regularized image domain data). Backpropagation, RMSprop, ADAM, or another optimization is used in learning the values of the learnable parameters. Where the training is supervised, the differences (e.g., L1, L2, or mean square error) between the estimated output and the ground truth output are minimized. Joint training (e.g., semi-supervised) may be used.

The training uses multiple samples of input sets, such as object domain data representing patients after Fourier transform and/or gradient calculation. The measurements for these samples are generated by scanning a patient and/or phantom with different settings or sequences, scanning different patients and/or phantoms with the same or different settings or sequences, and/or simulating MR scanning with an MR scanner model. By using many samples, the model is trained given a range of possible inputs. The samples are used in deep learning to determine the values of the learnable variables (e.g., values for convolution kernels) that produce outputs with minimized cost function and/or maximized likelihood of being a good representation (i.e., discriminator cannot tell the difference) across the variance of the different samples. Masking of the measurements may or may not be used for training.

In one embodiment, reconstruction use a selected number of iterations. The same CNN 301 is used for each iteration. Once trained, the machine-learned model is used for reconstruction of a spatial representation from input k-space measurements for a patient 11. Some of or all the iterations use k-space measurements as an input. The k-space measurements may be input to a machine-learned model or to a function/operation of the reconstruction (e.g., gradient update).

In an embodiment, applying a temporal 1D FFT provides an even sparser representation, enabling the CNN 301 to handle noise and streaking artifacts better. To avoid long processing times of 3D and 2.5D networks, a 2D U-Net may be used to process the input 2D+t data in the xt-, yt-, and xy-domains with weight sharing applied (assuming isotropic data and similar artifacts in different branches). For a more flexible network, deformable convolutions are utilized in the CNN 301 design allowing for an adaptive receptive field that is learned from the data and varies according to the object's scale. Deformable convolutions avoid the inherent locality constraints of conventional convolutions, which is essential in GRASP applications where learning spatially and temporally variant representations is key. The output 2D slices from different branches are fused by simply computing the mean or via a lightweight network (few convolutional layers). Finally, the inverse 1D FFT along the temporal direction is applied, and the temporal mean is added back to obtain the CNN 301 output.

Figure 4:
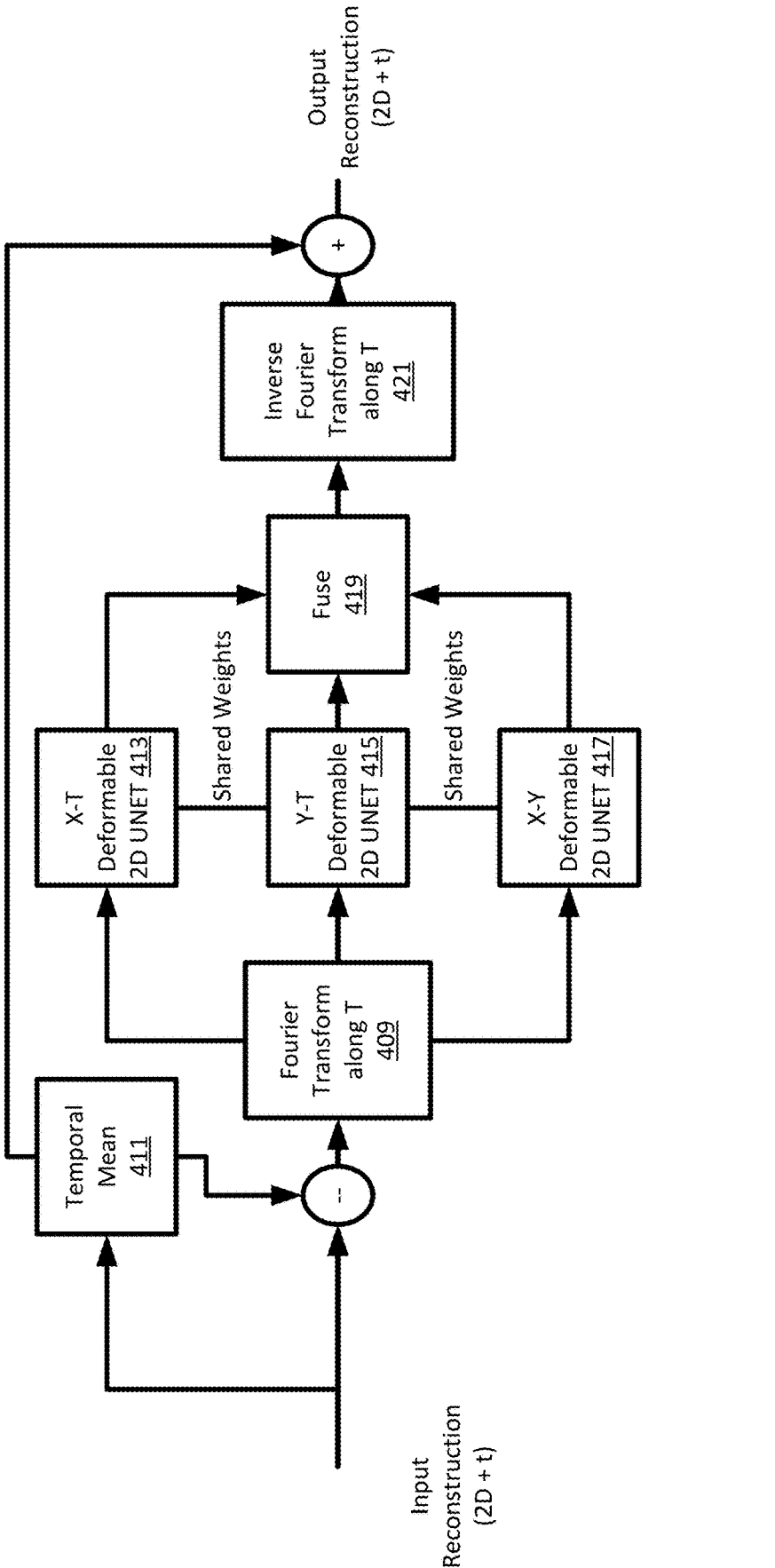
FIG. 4 depicts an example of a CNN of the reconstruction network according to an embodiment.

FIG. 4 depicts one example of a spatiotemporal CNN 301 regularizer. The temporal mean 411 is first removed from the input (2D+t) data, followed by a sparsifying transform 409 (e.g., 1D Fourier transform) along the temporal dimension. The transformed image is then reshaped into the xt-, yt- and xy-domains with a 2D U-Net with deformable convolutions 413, 415, 417 to process all the resulting 2D slices. Finally, the output 2D slices are fused 419 (e.g., computing the mean or some trainable convolutional layers), and the inverse sparsifying transform 421 is applied before the temporal mean 411 is added. The same U-Net may be used for all branches, i.e., the weights are shared. Weight sharing can be disabled for non-isotropic data and/or if artifacts differ across branches.

A sparser representation may be obtained for more efficient learning by subtracting the temporal mean. The temporal mean may also be obtained using a sliding window approach in a temporal and/or a spatial dimension that still has a time dependence. For the first instance (cascade) in the complete network, the mean may be computed by collapsing all the input spokes of different time points with the adjoint NUFFT operator.

Figure 5:
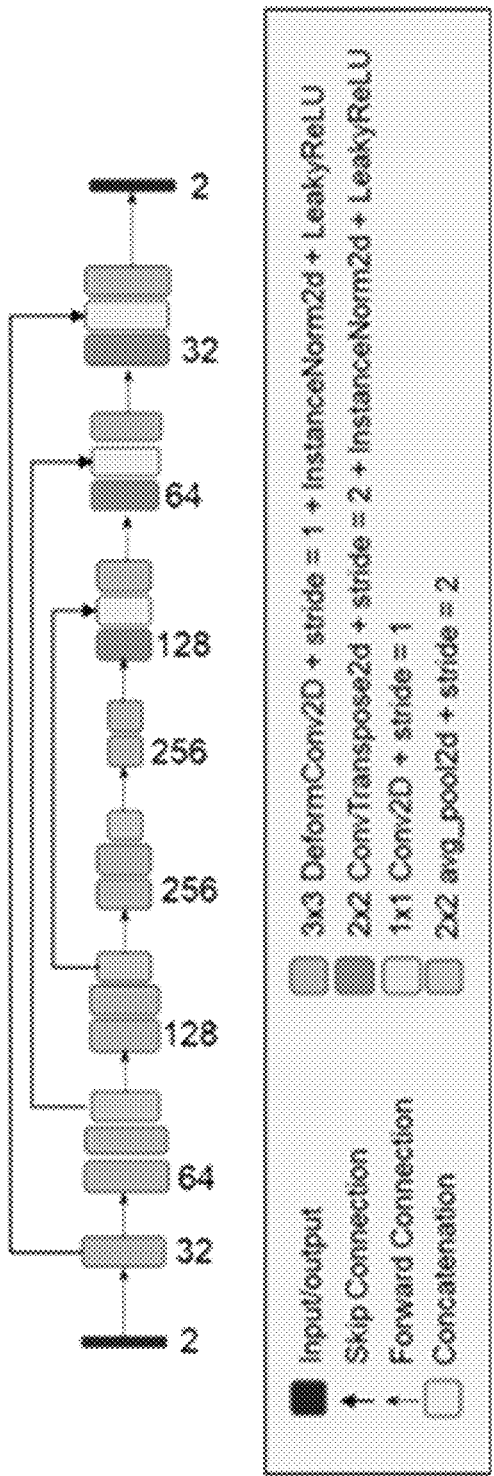
FIG. 5 depicts an example 2D Unet according to an embodiment.

FIG. 5 depicts an example of a 2D U-net that may be used in FIG. 3 or FIG. 4 as the CNN 301. In the example U-net, deformable convolutions are utilized to enable the CNN 301 the flexibility to learn various geometric transformations according to the given input dynamic data.

The data consistency step 303 of FIG. 3 may be enforced by any type of data consistency update. In one embodiment, the data consistency step 303 is implemented as a finite number of iterations of a conjugate gradient (CG) method used to solve the system given by: Hx=b $$H = A^H A + \lambda I$$
$$b = A^H Dy + \lambda x$$

Where $A^H$, A operators incorporate computationally expensive NUFFT operations with gridding of the k-space coefficients involved. The density compensation function D is optionally used to s for preconditioning the linear system which needs to be solved. The regularization parameter $\lambda$ may also be trainable (with strictly positive constraints) for better tradeoff between the CNN 301 and DC step(s) 303.

The training of the reconstruction network 300 is a two-stage process. First, in a pretraining step, a single CNN 301 is trained on image pairs (initial NUFFT reconstruction and corresponding ground truth) in a supervised manner to minimize a given loss such as complex L1. In the next stage of training, the complete network is constructed with CG data consistency layers 303 added with CNN weights initialized from the previous step to fine-tune the CNN weights as well as learn the regularization parameter in each iteration for optimal final reconstruction. The number of iterations of CNN 301/DC layer(s) 303 may be selected based on the acceleration of the acquisition and/or hardware requirements. In an example, the higher the acceleration the more iterations may be needed to provide an acceptable result. In another example, if there are fewer resources available (processing capabilities/time) fewer iterations may be selected. Self-supervised methods may also be utilized in the absence of good quality ground truth data which is typical for high temporal resolution GRASP.

Figure 6:
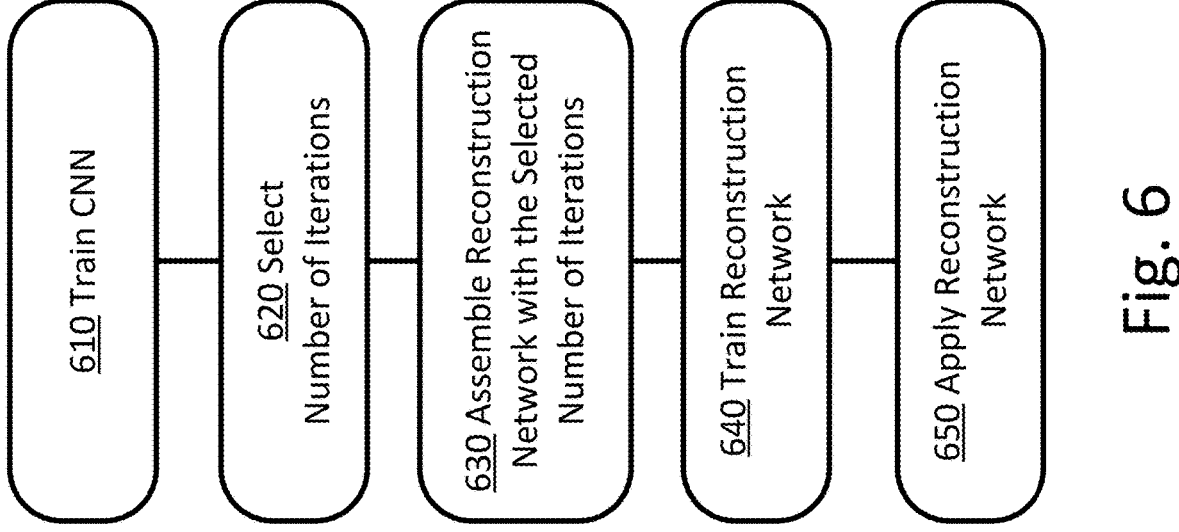
FIG. 6 depicts a workflow for configuring a reconstruction network according to an embodiment.

FIG. 6 is a flow chart diagram of one embodiment of a method for providing a reconstruction network 300 for non-cartesian MRI acquisition. The method is performed by the system of FIGS. 2, 3, 4, 5 or another system. The method is performed in the order shown or other orders. Additional, different, or fewer acts may be provided. The selection of iterations may be made at any point. The training data may be acquired at any point prior to the CNN 301 and complete reconstruction network 300 being trained. The complete reconstruction network 300 and the CNN 301 may be retrained on new data as additional training data is acquired. Synthetic training data may also be used. Unsupervised training may be used in one or more of the training steps.

At act 610, a CNN 301 is trained using training data. FIG. 5, described above, depicts one example of a CNN 301 that may be used. The training data may include image pairs including initial NUFFT reconstruction and corresponding ground truth. The learnable parameters of the single CNN 301 are identified through supervised machine training. The training data includes many sets of data, such as representations output by reconstruction and the corresponding ground truth. Tens, hundreds, or thousands of samples are acquired, such as from scans of volunteers or patients, scans of phantoms, simulation of scanning, and/or by image processing to create further samples. Many examples that may result from different scan settings, patient anatomy, scanner characteristics, or other variance that results in different samples are used. In one embodiment, an already gathered or created MR dataset is used for the training data. The samples are used in machine learning (e.g., deep learning) to determine the values of the learnable variables (e.g., values for convolution kernels) that produce outputs with minimized cost or loss across the variance of the different samples. One or more processor(s) 22 machine train the reconstruction network 300. For example, the reconstruction network 300 is machine trained using a plurality of specially designed processors and training data. In one embodiment, deep learning is used. The training learns both the features of the input data and the conversion of those features to the desired output. Backpropagation, RMSprop, ADAM, or another optimization is used in learning the values of the learnable parameters of the CNN 301. Where the training is supervised, the differences (e.g., L1, L2, mean square error, or other loss) between the estimated output and the ground truth output are minimized. Any architecture or layer structure for machine learning to perform an operation for separately reconstructing from subsets may be used. For example, any of the architectures may be used. The architecture defines the structure, learnable parameters, and relationships between parameters. In one embodiment, a CNN 301 is used. Any number of layers and nodes within layers may be used. A DenseNet, U-Net, encoder-decoder, Deep Iterative Down-Up CNN, image-to-image and/or another network may be used. Some of the network may include dense blocks (i.e., multiple layers in sequence outputting to the next layer as well as the final layer in the dense block). Any now known or later developed neural network may be used. Any number of hidden layers may be provided between the input layer and output layer. The learning is an offline training phase where the goal is to identify an optimal set of values of learnable parameters of the model that can be applied to many different inputs. These machine-learned parameters can subsequently be used during clinical operation.

In typical machine training, a data set is divided into two or more sections, for example, a training set used to train a model and a test set used to test the trained model. The goal of training is to generate a model using the training data set that performs well on the test set. Test time training may also be used to adjust the model/network to new data. Test time training allows for a model, here the single CNN 301 to be trained generally using a training data set but then adjusted during test time.

In an embodiment self-supervised methods may also be utilized in the absence of good quality ground truth data which may be lacking for high temporal resolution GRASP.

At act 620, a number of iterations N is selected at test time. The number of iterations N may depend on the MRI scanning device, clinical applications, the acceleration factor of the intended acquisition, and/or the hardware resources/time available. Configuring a reconstruction network 300 end to end with multiple iterations may be computationally intensive. If there are fewer resources available to train the network or if there is a time constraint, fewer iterations may be used. For lower acceleration levels, fewer iterations may be needed.

At act 630 the reconstruction network 300 is assembled with the selected number of iterations N of the trained CNN 301 including a data consistency step 303 in each iteration. At act 640, the reconstruction network 300 is trained with the selected number of iterations N of the trained CNN 301 and data consistency steps 303. The CNNs 301 of different iterations N share the same weights. Training is used to adjust the weights of the entire network. In an embodiment, the complete network is constructed with data consistency layers 303 added with CNN weights initialized from the previous step to fine-tune the CNN weights as well as learn the regularization parameter in each iteration for optimal final reconstruction. The data consistency step(s) 303 may use a conjugate gradient method. In one embodiment, a data consistency step 303 is implemented as a finite number of iterations of a conjugate gradient (CG) method used to solve the system given by: Hx=b $$H = A^H A + \lambda I$$
$$b = A^H Dy + \lambda x$$

Where $A^H$, A operators incorporate computationally expensive NUFFT operations with gridding of the k-space coefficients involved. The density compensation function D is optionally used to s for preconditioning the linear system which needs to be solved. The regularization parameter $\lambda$ may also be trainable (with strictly positive constraints) for better tradeoff between the CNN 301 and DC 303 steps.

The training data for this stage of training may come from a particular distribution that relates to the use of the reconstruction network 300. For example, if the goal is to provide a reconstruction network 300 for a particular acceleration, the training data may also be related to the particular acceleration.

Figure 7:
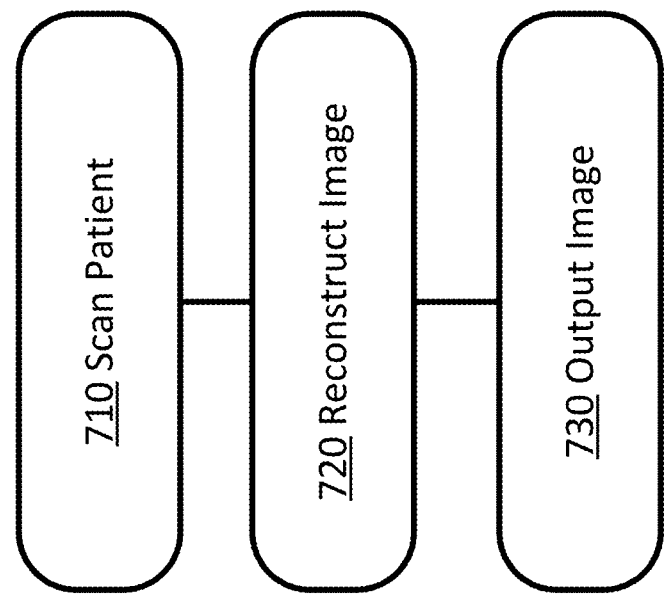
FIG. 7 depicts a workflow for applying the reconstruction network of FIG. 6 according to an embodiment.

At act 650, once trained, the reconstruction network 300 is applied to non-cartesian MRI data. FIG. 7 is a flow chart diagram of one embodiment of a method for application of a trained reconstruction network 300 in a medical imaging system 100, such as for reconstruction of a MR image in an MR system 100. The method is performed by the system 100 of FIG. 2 or another system and may use the complete reconstruction network 300 of FIG. 3 and/or the CNN 301 of FIG. 4. Other components may be used, such as a remote server or a workstation performing the acquisition of the scan data, the reconstruction, and/or the display. The method is performed in the order shown or other orders. Additional, different, or fewer acts may be provided. The output of the reconstruction process may be further processed or analyzed, for example by an addition neural network or model that is configured to further augment or process the image. As another example, the image is stored in a memory (e.g., computerized patient medical record) or transmitted over a computer network instead of or in addition to the output of act 730.

In act 710, the imaging device 36 scans a patient 11. The scan is guided by a protocol, such as parallel imaging with compressed sensing or another protocol. The pulse or scan sequence scans the region of the patient 11, resulting in scan data for a single imaging appointment. In an MR example, a pulse sequence is created based on the configuration of the MR scanner (e.g., the imaging protocol selected). The pulse sequence is transmitted from coils into the patient 11. The resulting responses are measured by receiving radio frequency signals at the same or different coils. The scanning results in k-space measurements as the scan data. The scan uses a dynamic sequence including at least a time component, for example GRASP. The scan may use parallel imaging and/or compressed sensing. GRASP delivers high spatial and temporal resolution in volumetric MRI and is highly robust to the effects of patient motion. GRASP may be used in dynamic contrast-enhanced MRI of patients who may have trouble remaining still for long periods or performing lengthy breath holds in the scanner. The acquisition is performed in one continuous run using a golden-angle stack-of-stars radial scheme that gives robustness towards motion and the flexibility to choose the temporal resolution, which can even vary over the duration of the scan. Alternative scan sequences may be used that are non-Cartesian.

At act 720, the acquired MRI data is input into a trained reconstruction network 300 that includes one or more iterations, each iteration including at least a CNN 301 regularizer and a DC step 303. The reconstruction network 300 may be trained in multiple stages. In a first stage, a single CNN 301 is trained. In a subsequent stage, the complete network is constructed with CG data consistency 303 layers added with CNN weights initialized from the previous step to fine-tune the CNN weights as well as learn the regularization parameter in each iteration for optimal final reconstruction. A selected number of iterations are used to generate a complete network. A data consistency step 303, for example based on CG, is added after each CNN 301 for each iteration. In application of the already trained network, the reconstruction process is followed. The machine-learned model is used in the reconstruction.

At act 730, a representation is output by the trained reconstruction network 300. In response to the input for a given patient, a patient specific image is reconstructed. The machine-learned model outputs the image as pixels, voxels, and/or a display formatted image in response to the input. The learned values and network architecture, with any algorithms (e.g., extrapolation and gradient update) determine the output from the input.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description. Independent of the grammatical term usage, individuals with male, female or other gender identities are included within the term.

The following is a list of non-limiting illustrative embodiments disclosed herein:

Illustrative embodiment 1. A method for reconstructing non-cartesian magnetic resonance imaging (MRI) data, the method comprising: training a convolutional neural network (CNN) on image pairs to minimize a loss; selecting a number of iterations for a reconstruction network; assembling the reconstruction network with the number of iterations of the CNN, each iteration further including a data consistency step, wherein the CNN of different iterations share the same weights; training the reconstruction network end to end; and applying the reconstruction network to non-cartesian MRI data of a patient acquired from a medical imaging procedure.

Illustrative embodiment 2. The method of illustrative embodiment 1, wherein the non-cartesian MRI data is acquired using Golden-angle RAdial Sparse Parallel (GRASP).

Illustrative embodiment 3. The method according to one of the preceding embodiments, wherein the CNN comprises three deformable 2D UNet branches for xt-, yt-, and xy-domains with weight sharing between all of the three deformable 2D UNet branches.

Illustrative embodiment 4. The method according to one of the preceding embodiments, wherein the CNN is configured to perform regularization.

Illustrative embodiment 5. The method according to one of the preceding embodiments, wherein the CNN is trained using training data comprising image pairs including initial NUFFT reconstructions and corresponding ground truth.

Illustrative embodiment 6. The method according to one of the preceding embodiments, wherein the data consistency step comprises conjugate gradient data consistency.

Illustrative embodiment 7. The method according to one of the preceding embodiments, wherein selecting the number of iterations is based on available hardware resources for training the reconstruction network.

Illustrative embodiment 8. The method according to one of the preceding embodiments, wherein selecting the number of iterations is based on a targeted acceleration.

Illustrative embodiment 9. The method according to one of the preceding embodiments, wherein selecting the number of iterations is based on a clinical application.

Illustrative embodiment 10. A system for magnetic resonance imaging (MRI) reconstruction, the system comprising: an MR imaging device configured to acquire non cartesian MRI data of a patient; a reconstruction network configured to input the non cartesian MRI data and output a representation, the reconstruction network comprising a selected number of iterations, wherein each iteration includes a convolutional neural network (CNN) and a data consistency step, wherein the reconstruction network is trained in two stages, wherein in a first stage of the two stages a single iteration of the CNN is trained, wherein in a second stage of the two stages, the reconstruction network comprising the selected number of iterations is trained end to end wherein weights for the CNN in each iteration are initialized with weights learned in the first stage; and a display configured to display the representation.

Illustrative embodiment 11. The system according to one of the preceding embodiments, wherein the non cartesian MRI data is acquired using radial sampling.

Illustrative embodiment 12. The system according to one of the preceding embodiments, wherein the CNN comprises three deformable 2D UNet branches for xt-, yt-, and xy-domains with weight sharing between all of the three deformable 2D UNet branches.

Illustrative embodiment 13. The system according to one of the preceding embodiments, wherein the number of iterations is selected based on at least one of available hardware resources for training the reconstruction network, a targeted acceleration, or a clinical application for the representation.

Illustrative embodiment 14. The system according to one of the preceding embodiments, wherein the data consistency step comprises conjugate gradient data consistency.

Illustrative embodiment 15. The system according to one of the preceding embodiments, wherein in the first stage, the CNN is trained using image pairs including initial NUFFT reconstructions and corresponding ground truth.

Illustrative embodiment 16. The system according to one of the preceding embodiments, wherein the CNN is configured to perform regularization.

Illustrative embodiment 17. A method for MRI reconstruction, the method comprising: acquiring non cartesian MRI data of a patient; reconstructing a representation of the patient using a reconstruction network configured to input the non cartesian MRI data and output a representation, the reconstruction network comprising a selected number of iterations, wherein each iteration includes a convolutional neural network (CNN) and a data consistency step, wherein the reconstruction network is trained in two stages, wherein in a first stage of the two stages a single iteration of the CNN is trained, wherein in a second stage of the two stages, the reconstruction network comprising the selected number of iterations is trained end to end wherein weights for the CNN in each iteration are initialized with weights learned in the first stage; and displaying the representation of the patient.

Illustrative embodiment 18. The method according to one of the preceding embodiments, wherein the number of iterations is selected based on at least one of available hardware resources for training the reconstruction network, a targeted acceleration, or a clinical application for the representation.

Illustrative embodiment 19. The method according to one of the preceding embodiments, wherein the CNN comprises three deformable 2D UNet branches for xt-, yt-, and xy-domains with weight sharing between all of the three deformable 2D UNet branches.

Illustrative embodiment 20. The method according to one of the preceding embodiments, wherein the data consistency step comprises conjugate gradient data consistency.

The invention claimed is:

1. A method for reconstructing non-cartesian magnetic resonance imaging (MRI) data, the method comprising:
    training a convolutional neural network (CNN) on image pairs to minimize a loss;
    selecting a number of iterations for a reconstruction network;
    assembling the reconstruction network with the number of iterations of the CNN, each iteration further including a data consistency step, wherein the CNN of different iterations share the same weights;
    training the reconstruction network end to end; and
    applying the reconstruction network to non-cartesian MRI data of a patient acquired from a medical imaging procedure.

2. The method of claim 1, wherein the non-cartesian MRI data is acquired using Golden-angle RAdial Sparse Parallel (GRASP).

3. The method of claim 1, wherein the CNN comprises three deformable 2D UNet branches for xt-, yt-, and xy-domains with weight sharing between all of the three deformable 2D UNet branches.

4. The method of claim 1, wherein the CNN is configured to perform regularization.

5. The method of claim 1, wherein the CNN is trained using training data comprising image pairs including initial NUFFT reconstructions and corresponding ground truth.

6. The method of claim 1, wherein the data consistency step comprises conjugate gradient data consistency.

7. The method of claim 1, wherein selecting the number of iterations is based on available hardware resources for training the reconstruction network.

8. The method of claim 1, wherein selecting the number of iterations is based on a targeted acceleration.

9. The method of claim 1, wherein selecting the number of iterations is based on a clinical application.

10. A system for magnetic resonance imaging (MRI) reconstruction, the system comprising:
    an MR imaging device configured to acquire non-cartesian MRI data of a patient;

a reconstruction network configured to input the non cartesian MRI data and output a representation, the reconstruction network comprising a selected number of iterations, wherein each iteration includes a convolutional neural network (CNN) and a data consistency step, wherein the reconstruction network is trained in two stages, wherein in a first stage of the two stages a single iteration of the CNN is trained, wherein in a second stage of the two stages, the reconstruction network comprising the selected number of iterations is trained end to end wherein weights for the CNN in each iteration are initialized with weights learned in the first stage; and
    a display configured to display the representation.

11. The system of claim 10, wherein the non cartesian MRI data is acquired using radial sampling.

12. The system of claim 10, wherein the CNN comprises three deformable 2D UNet branches for xt-, yt-, and xy-domains with weight sharing between all of the three deformable 2D UNet branches.

13. The system of claim 10, wherein the number of iterations is selected based on at least one of available hardware resources for training the reconstruction network, a targeted acceleration, or a clinical application for the representation.

14. The system of claim 10, wherein the data consistency step comprises conjugate gradient data consistency.

15. The system of claim 10, wherein in the first stage, the CNN is trained using image pairs including initial NUFFT reconstructions and corresponding ground truth.

16. The system of claim 10, wherein the CNN is configured to perform regularization.

17. A method for MRI reconstruction, the method comprising:
    acquiring non cartesian MRI data of a patient;
    reconstructing a representation of the patient using a reconstruction network configured to input the non cartesian MRI data and output a representation, the reconstruction network comprising a selected number of iterations, wherein each iteration includes a convolutional neural network (CNN) and a data consistency step, wherein the reconstruction network is trained in two stages, wherein in a first stage of the two stages a single iteration of the CNN is trained, wherein in a second stage of the two stages, the reconstruction network comprising the selected number of iterations is trained end to end wherein weights for the CNN in each iteration are initialized with weights learned in the first stage; and
    displaying the representation of the patient.

18. The method of claim 17, wherein the number of iterations is selected based on at least one of available hardware resources for training the reconstruction network, a targeted acceleration, or a clinical application for the representation.

19. The method of claim 17, wherein the CNN comprises three deformable 2D UNet branches for xt-, yt-, and xy-domains with weight sharing between all of the three deformable 2D UNet branches.

20. The method of claim 17, wherein the data consistency step comprises conjugate gradient data consistency.

* * * * *